US008828624B2

(12) United States Patent
Gapontsev et al.

(10) Patent No.: US 8,828,624 B2
(45) Date of Patent: Sep. 9, 2014

(54) METHOD AND DEVICE FOR FABRICATING VOLUME BRAGG GRATINGS

(75) Inventors: Valentin P Gapontsev, Worcester, MA (US); Alex Ovtchinnikov, Worcester, MA (US); Dmitry Starodubov, Dudley, MA (US); Alexey Komissarov, Charlton, MA (US)

(73) Assignee: IPG Photonics Corporation, Oxford, MA (US)

(*) Notice: Subject to any disclaimer, the term of this patent is extended or adjusted under 35 U.S.C. 154(b) by 622 days.

(21) Appl. No.: 12/534,437

(22) Filed: Aug. 3, 2009

(65) Prior Publication Data
US 2011/0027720 A1  Feb. 3, 2011

(51) Int. Cl.
*G03H 1/30* (2006.01)
*G03H 1/02* (2006.01)
*G03F 7/00* (2006.01)
*G02B 5/18* (2006.01)
*G03H 1/20* (2006.01)

(52) U.S. Cl.
CPC ............ *G03F 7/001* (2013.01); *G03H 2222/36* (2013.01); *G03H 1/0248* (2013.01); *G03H 2227/03* (2013.01); *G02B 5/1857* (2013.01); *G03H 1/30* (2013.01); *G03H 2001/205* (2013.01); *G03H 2001/0268* (2013.01)
USPC .......................... 430/1; 430/2; 359/35; 359/25

(58) Field of Classification Search
None
See application file for complete search history.

(56) References Cited

U.S. PATENT DOCUMENTS

| 4,547,002 | A | * | 10/1985 | Colgate, Jr. .................... 283/91 |
| 4,715,670 | A | * | 12/1987 | Turukhano ...................... 359/12 |
| 4,904,033 | A | * | 2/1990 | Ikeda et al. ..................... 359/12 |
| 5,367,588 | A | | 11/1994 | Hill et al. |
| 5,491,570 | A | | 2/1996 | Rakuljic et al. |
| 5,500,313 | A | * | 3/1996 | King et al. ...................... 430/11 |
| 5,635,976 | A | * | 6/1997 | Thuren et al. ................ 347/253 |
| 5,646,765 | A | * | 7/1997 | Laakmann et al. ......... 359/202.1 |
| 5,912,999 | A | | 6/1999 | Brennan, III et al. |
| 6,586,141 | B1 | * | 7/2003 | Efimov et al. ...................... 430/1 |
| 7,391,703 | B2 | | 6/2008 | Volodin et al. |
| 7,406,225 | B1 | | 7/2008 | Efimov |
| 2002/0045132 | A1 | * | 4/2002 | Inoue et al. ................... 430/296 |
| 2003/0219205 | A1 | * | 11/2003 | Volodin et al. ................. 385/37 |
| 2004/0130786 | A1 | * | 7/2004 | Putnam et al. ................ 359/566 |

(Continued)

FOREIGN PATENT DOCUMENTS

| JP | 06-059614 | * | 3/1994 |
| JP | 10-048450 | * | 2/1998 |

OTHER PUBLICATIONS

Krug et al. Directly photoinscribed refractive index change and Bragg gratings in Ohara WMS-15 ceramic glass. Appl. Opt., vol. 48(18) pp. 3429-3437 (on-line May 19, 2009).*

(Continued)

*Primary Examiner* — Martin Angebranndt
(74) *Attorney, Agent, or Firm* — Yuri Kateshov, Esq.; Timothy J. King, Esq.

(57) ABSTRACT

A system for recording multiple volume Bragg gratings (VBGs) in a photo thermo-refractive material is configured to implement a method which provides for irradiating the material by a coherent light through a phase mask. The system has a plurality of actuators operative to displace the light source, phase mask and material relative to one another so as to mass produce multiple units of the material each having one or more uniformly configured VBGs.

19 Claims, 3 Drawing Sheets

(56) References Cited

U.S. PATENT DOCUMENTS

| | | |
|---|---|---|
| 2005/0018966 A1* | 1/2005 | Sasaki et al. ............... 385/37 |
| 2006/0012899 A1* | 1/2006 | Goelles et al. ............ 359/868 |
| 2007/0236796 A1 | 10/2007 | Putnam et al. |
| 2008/0090158 A1* | 4/2008 | Painchaud et al. ............ 430/5 |
| 2009/0190214 A1* | 7/2009 | Borrelli et al. ............ 359/486 |
| 2009/0262774 A1* | 10/2009 | Long ..................... 372/49.01 |

OTHER PUBLICATIONS

Smirnov et al. "Adjustable diffraction filter for high power lasers", Proc. CLEO 03 2 pages (2003).*

Zolotovskaya et asl., "Stable dual wavelength operation in InGeAs diosde lasers with volume Bragg gratings", Appl. Phys. Lett., vol. 91 pp. 17113-1 to 171113-3 (Oct. 2007).*

Harun, "Fabrication and Application of Fiber Bragg Grating", Thesis, University of Malay, (Apr. 2001) 130 pages.*

Rotari et al. "Refractive index modulation in photo-thermo-refractive fibers", Proc. SPIE vol. 5709, pp. 379-384 (2005).*

Laser Mech catalog 16 pages (2002).*

Faerch "Direct UV writing of waveguides", Thesis Technical Univerisity of Denmark, 100 pages (Oct. 2003).*

\* cited by examiner

Resulting elements

Dicing

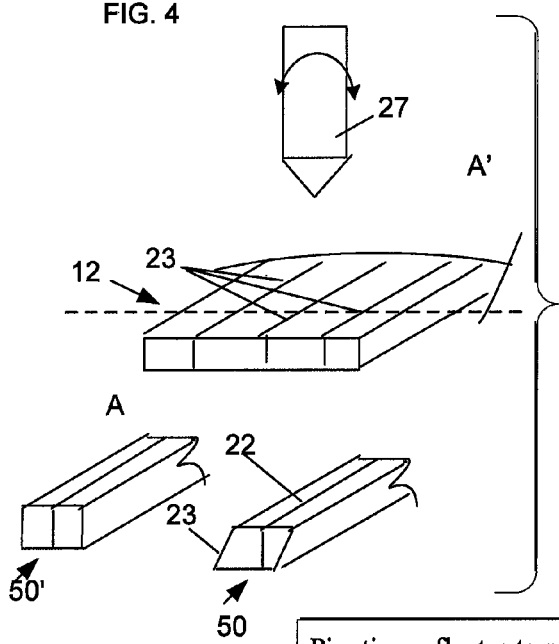
FIG. 4
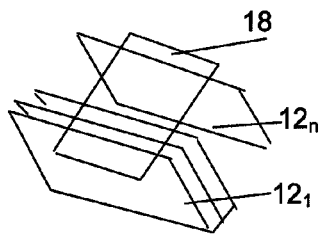
FIG. 5
FIG. 6

METHOD AND DEVICE FOR FABRICATING VOLUME BRAGG GRATINGS

BACKGROUND OF THE DISCLOSURE

1. Field of the Disclosure

The invention relates to a method for fabricating volume diffractive elements in photo-thermo refractive glass. More particularly, the invention relates to holographic optical elements and specifically, to volume Bragg gratings (VBG) fabricated in doped photo-thermo refractive (PTR) glasses.

2. Discussion of Prior Art

The diffractive optical elements including VBG and UV light induced refractive index structures, which are fabricated in photothermorefractive glass, have been recently widely accepted in optoelectronics. VBGs, for example, are the effective optical solution to stabilizing the output wavelength from a commercial laser diode.

A typical method for recording VBGs involves a prism-based interferometer which has a thin elongated plate of photosensitive glass coupled to the prism's face. See U.S. Pat. No. 7,391,703 which is incorporated herein in its entirety by reference. The prism is made from material transparent at a given wavelength. The exposure of the prism to an incident light wave leads to the recordation of VBGs along the plate's surface.

A few inconveniences may be encountered during the manufacturing process of VBGs using the above-discussed interferometric approach. For example, the intensity of the exposure should be uniform in order to have uniform index change and refractive index modulation along and across the plate. This, however, may be technologically challenging. Also challenging may be the spatial stability between the beam and the plate coupled to the prism, which likewise is required for a reproducible fabrication of gratings. The coupling between the prism and plate may be sensitive to misalignment and requires a good mechanical stability. A further inconvenience presented by this method may include dicing the plate so to receive individual VBGs since it is being done by cutting the plate transversely to the longitudinal direction of the grating fringes, when the angle between the grating planes and the glass surface is desired.

A further method of volume grating fabrication using side interferometric recording allows for the fabrication of large and thick volume holograms as taught U.S. Pat. No. 5,491,570 which is incorporated herein in its entirety by reference. This approach, like the one previously discussed, may not be efficient in mass production because of the difficulty to maintain the desired alignment between the components. In addition, this method does not teach teaching dicing a slab of glass because the final product includes large, thick volume holograms, not small VBGs.

Method for manufacturing fiber Bragg gratings utilizes a simpler, more efficient approach than those discussed above. A grating is typically imprinted in the core of an optical fiber using a silica glass grating phase mask, as disclosed in U.S. Pat. No. 5,367,588 which is incorporated herein in its entirety by reference. "Laser irradiation of the phase mask with ultraviolet light at normal incidence imprints into the optical fiber core the interference pattern created by the phase mask." Id. Structurally, an apparatus for implementing the method is configured with a stationary light source radiating light having a Gaussian profile which is incident upon the mask that, in turn, is juxtaposed with a fiber.

A few obvious advantages of using a phase mask include, but not limited to, the use of low coherence excimer lasers for grating fabrication and reliable and reproducible length of gratings. These advantages are critical for efficient mass production. Perhaps one of possible undesirable consequences associated with the fiber grating production process stems from the stationary light source which is typically a laser with a long coherence wavelength.

In general, any lengths of fiber can be irradiated as long as it does not exceed the dimension of the used mask. However, the radiation emitted by the single mode stationary laser has a substantially Gaussian profile characterized by a high intensity field along the laser axis and smaller field intensities gradually changing as the wings of the profile run away from its central, axial region. As a consequence, the mask is not uniformly exposed to light which leads to the variation of grating parameters such as reflectivity and central wavelength. The field uniformity issue was resolved by a laser displaceable relative to a mask. See U.S. Pat. No. 5,066,133 incorporated herein in its entirety by reference.

A need, therefore, exists for a method of fabricating VBGs in an efficient manner used in mass production.

Another need exists for the method of fabricating VBGs which is characterized by the light (UV) exposure uniformity.

Still another need exists for the method of fabricating VBGs which is characterized by the reproducibility of the grating's parameters, particularly, grating period so important in mass production.

SUMMARY OF THE DISCLOSURE

These needs are met by the present disclosure which utilizes a phase mask and displacement of the mask and laser source relative to one another so as to mass produce transverse holographic elements, such as VBGs, in photo thermo-refractive glass. The disclosed apparatus allows for, among others, a uniform index change, central wavelength and radiation dosage, high mass productivity amounting to at least 95% of products exceeding the established quality standards and reproducibility of grating parameters.

In accordance with one aspect of the disclosure, the disclosed apparatus provides for exposing a one-piece thick slab to a UV light which is incident upon an elongated phase mask located between the light source and slab. The exposure is accompanied by relative displacement of a light source, radiating UV light and the mask so as to uniformly irradiate the slab. Preferably, but not necessarily, the light source moves relative to the stationary mask.

The configuration including the phase mask and light source, which are displaceable relative to one another, produces a plurality of parallel volume Bragg gratings (VBGs) formed along the exposed surface of the material to be irradiated and extending through the latter. According to one of salient features of the disclosed apparatus and method, the position of gratings allows a dicing saw to cut the slab along the gratings, not perpendicular thereto, as taught in the known prior art.

In accordance with a further aspect of the disclosure, instead of fabricating VBGs in the one-piece slab and further dicing the latter so as to produce individual volume gratings, the slab is initially cut into a plurality of uniform units. The individual units are stacked together and exposed to the displaceable UV source in a manner similar to the previously disclosed aspect.

BRIEF DESCRIPTION OF THE DRAWINGS

The above and other aspects, features and advantages of the presently disclosed method will become more readily apparent from the following specific description illustrated in the accompanying drawings, in which:

FIG. 4 illustrates a cutting stage configured in accordance to the disclosed method.

FIG. 5 illustrates units of material to be irradiated provided in accordance with one aspect of the disclosed method.

FIG. 6 illustrates a flow chart representing the main steps of the disclosed method.

SPECIFIC DESCRIPTION

Figure 1:
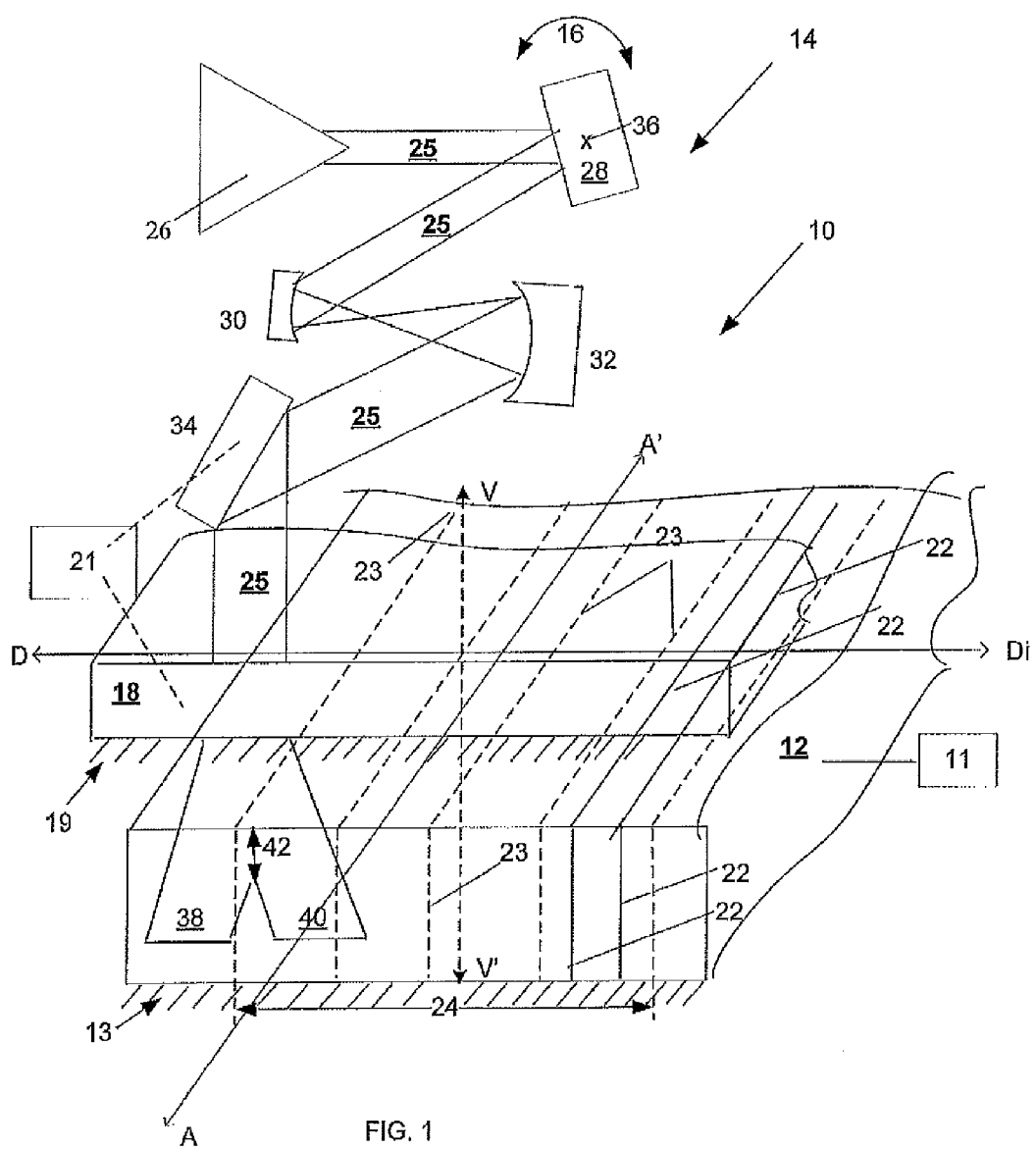
FIG. 1 a highly diagrammatic view of an assembly operative to implement the disclosed method.

Reference will now be made in detail to the disclosed system. Wherever possible, same or similar reference numerals are used in the drawings and the description to refer to the same or like parts or steps. The drawings are in simplified form and are far from precise scale.

FIG. 1 illustrates a system 10 configured to implement a method for recording volume Bragg gratings (VBGs) in a slab 12 of photo-thermo refractive glass. The system 10 further includes a light generating assembly 14 which is operative to radiate a UV beam 25 incident on a phase-mask 18. The mask 18 is disposed either in contact with or close to slab 12 which is axially substantially coextensive with the mask and configured as a host material for recorded VBGs. If the dimensions of slab 12 are selected to be greater than those of mask 18, several masks can be disposed along the slab. The mask 18 is operated in a manner well known to one of ordinary skills in the semiconductor manufacturing art. The slab 12 includes an elongated body extending along axis A-A' and mounted to a support 13. The system 10 operates so that mask 18, source assembly 14 and slab 12 may all be linearly displaceable relative to one another by an actuator 21. In a preferred embodiment explained hereinbelow, light assembly 14 is operative to move relative to stationary mask 18 on a direction parallel to elongated axis A-A' of slab 12. The displacement of the light source assembly and mask/slab combination may be reversed so that mask 18 and slab 12, which are mounted to respective supports 13, 19 or simply displaceably fixed to one another, move relative to UV beam 25. The relative displacement allows for the formation of any arbitrary length of a grating region 24. Even more importantly, the relative displacement of these components provides for a substantially uniform distribution of high intensity field of light beam 25 over grating region 24. As a result of the irradiation of slab 12, a plurality of fringes 23, as shown in dash lines, are produced in the slab to define grating region 24 which is further diced along the fringes to form a plurality of individual, separated from one another units.

The light generating assembly 14 is configured so as to write VBGs 22 at the desired depth within slab 12 and, of course, along the desired length of grating region 24. The assembly includes a light source, such as a laser 26 which may be configured as a fiber laser radiating output beam 25 in substantially a fundamental mode with a Gaussian profile. The beam 25 propagates along a light path until it impinges a first light reflecting component, such as an upstream mirror 28, which is mounted on axis 36 so as rotate as shown by double arrow 16. The angular displacement of mirror 28 allows for setting the desired distance at which laser 26 may be located from a VBG writing assembly, i.e. mask 18 without actual displacement of the laser along a vertical. The light generating assembly 14 is further configured with a beam expander which may include two light reflecting elements, such as concave-formed mirror 30 and 32. The beam expander is configured to modify the dimension of light spot at slab 12 produced by interfering beams 38 and 40, respectively. The greater the overlap 42 between the interfering beams, the greater the depth of light penetration into slab 12. The beam expansion factor is determined by the ratio of focal lengths of respective elements 30 and 32. Thus, elements 30 and 32 should have the overlapping focus in order to have the collimated beam output, which can be obtained by displacing these elements relative to one another. Finally, a scanning light reflecting element 34 routes expanded beam 25 towards a writing assembly 44 which includes mask 18 and slab 12. To irradiate the desired dimensions of entire grating region 24 uniformly, element 34 may be controllably displaced by actuator 21 so as to optimize the uniformity of the exposure dose. Alternatively, as disclosed above, supports 13 and 19, respectively, are displaced relative to assembly 14.

Figure 3:
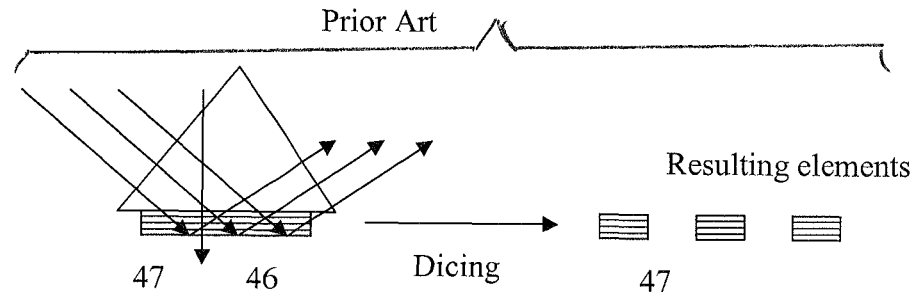
FIG. 3 is a diagrammatic view conceptually illustrating the known prior art.
Figure 2:
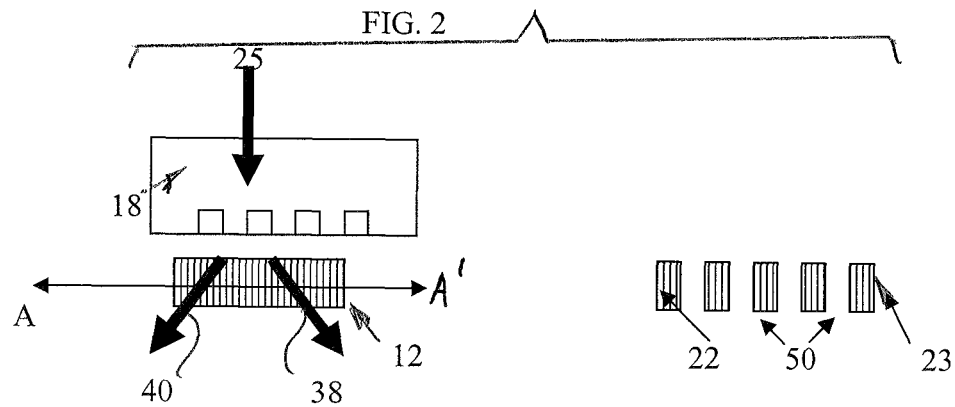
FIG. 2 is a diagrammatic view illustrating the concept underlying the disclosed method.

FIG. 2 diagrammatically illustrates a VBG writing assembly 44. Due to the configuration of system 10 of FIG. 1, as beam 25 impinges against slab 12 while propagating through mask 18, gratings 22 are imprinted perpendicular to axis A-A'. Such a configuration allows for the simplicity of cutting slab 12 into individual units 50. As illustrated in FIG. 2, the cutting is realized in a direction perpendicular to axis A-A', i.e., parallel to the longitudinal dimension of grating 22 along fringes 23. In contrast, as shown in FIG. 3 representing the known art, the dicing of an elongated slab 46, extending along an axis C-C' and provided with a plurality of gratings 47, is performed across the gratings (see U.S. Pat. No. 7,391,703). Technologically, cutting slab 18 along fringes 23 is substantially easier than cutting the fringes of the prior art across the gratings.

Figure 2A:
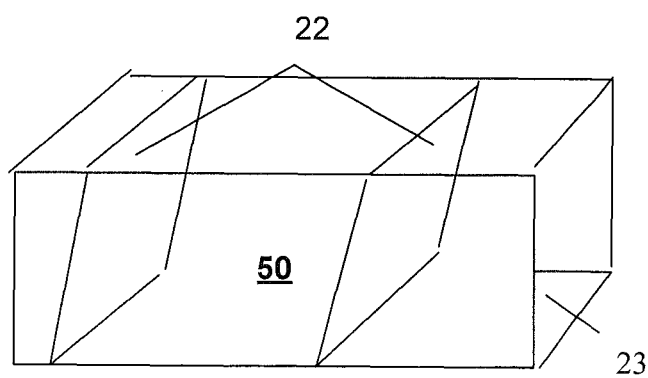
FIG. 2A is a view of separate unit of material provided with VBGs recorded in accordance with the assembly of FIG. 1.

Referring to FIG. 2A in addition to FIGS. 1 and 2, mask 18 and body 12 may be angularly displaceable, i.e. rotatable, as shown by a double-head arrow in FIG. 2 relative to one another about a vertical by, for example, actuator 21 of FIG. 1. This structure allows for the formation of slanted VBGs 22, as shown in FIG. 2A which illustrates rectangularly shaped units 50 (only one is shown) each having grating(s) 22 extend angularly to fringes 23 which are cut in a direction parallel to the longitudinal dimension of VBGs 22 perpendicular to longitudinal axis A-A' of FIG. 2.

Referring to FIGS. 1 and 4, upon completing the recording of VBGs 22, slab 12 may be placed on a translation stage (not shown) operative to pivot about axis A-A', as indicated by a double arrow in FIG. 2. Such a structure allows for dicing body 12 by a saw 27 into individual units 50 each having a parallelepiped-shaped configuration in which gratings 22 extend perpendicular to the opposite top and bottom surfaces of the unit. Alternatively, saw 27 may pivot relative to slap 12 so as to produce the parallelepiped-shaped units 50. Such a configuration may be useful when slanted fringes 23 are used to reflect undesirable frequencies so that the latter bypass a source of light, such as a laser diode. Of course, position of saw 27 and body 12 may be fixed for fabrication of rectangularly-shaped units 50'.

FIG. 6 illustrates general steps illustrating the above discussion. The adjustment of the desired distance between light assembly 14 and mask 18 is realized in step 52. To provide for the desired depth at which gratings 22 are to be written in body 12 or units 50 thereof, the expander of light source is adjusted in step 54. If necessary, relative rotation of step 56 may be performed either to have VBGs 22 extend parallel to fringes 23, as shown in step 56' or angularly as shown by step 56". Finally, step 58 illustrates a cutting stage of the disclosed process in which individual units 50 may have a rectangular shape as illustrated by step 58' or have fringes 23 slanted, as shown by step 58".

Although there has been illustrated and described in specific detail and structure of operations it is clearly understood that the same were for purposes of illustration and that changes and modifications may be made readily therein by those skilled in the art without departing of the spirit and the scope of this invention.

The invention claimed is:

1. A method for recording multiple volume Bragg gratings (VBGs) in a body of photo thermo-refractive material comprising the steps of:
    energizing a laser, thereby emitting a light beam along a light path,
    intercepting the light beam by an upstream mirror pivotal about an axis, which extends transversely to the light path, thereby providing a desired optical distance between the laser and a phase mask which is located upstream from the body;
    intercepting the reflected light beam by a beam expander configured with two spaced apart mirrors upstream from the phase mask and displacing the two spaced apart mirrors relative to one another thereby adjusting a spot size of the light beam to a desired spot size;
    exposing a phase mask to the light beam, the light beam being coherent, thereby irradiating the body of photo thermo-refractive material by the reflected light beam through the phase mask so as to form a plurality of spaced apart VBGs in the body at a desired depth corresponding to the desired spot size and; wherein the laser, upsteam mirror and beam expander are operative to move while the phase mask is stationary.

2. The method of claim 1 further comprising cutting the body in a plane parallel to a longitudinal dimension of the VBGs so as to provide multiple units with respective VBGs.

3. The method of claim 1 further comprising displacing the laser radiating the coherent light beam and the phase mask relative to one another, thereby substantially uniformly distributing a high intensity field of the light beam along a VBG region of the material which extends over the plurality of VBGs.

4. The method of claim 1, wherein foiming the VBGs includes rotating the phase mask and the body relative to one another about a vertical so as record the plurality of VBGs in the body extending angularly relative to the vertical.

5. The method of claim 1 further comprising cutting the body into a plurality of units and stacking the plurality of units prior to the irradiation.

6. The method of claim 1 further comprising displacing a dicing saw and the body relative to one another so as to cut the body into a plurality of units having respective parallelepiped-shaped cross-sections with respective VBGs which extend perpendicular to top and bottom of each unit.

7. The method of claim 1 further comprising cutting the body into a plurality of rectangularly shaped units formed with respective VBGs.

8. The method of claim 1 further comprising
    receiving the expanded coherent beam by a scanning reflector upstream from the mask so as to direct the expanded light beam towards the body, and simultaneously with directing the expanded light displacing the scanning reflector and the mask relative to one another.

9. A system for recording multiple volume Bragg gratings (VBGs) in a body made from photo thermo-refractive material, comprising:
    a laser source assembly operative to radiate a coherent light beam along a light path;
    an upstream mirror receiving the light beam downstream from the laser source and operative to pivot about an axis, which extends transversely to the light path, so as to adjust an optical distance between the laser source and body to a desired distance;
    a beam expander spaced downstream from the upstream mirror and including spaced first and second reflective elements, the elements being displaceable relative to one another along the light path so as to adjust a spot size of the received laser light beam from the upstream mirror to a desired spot size; and
    a phase mask located between the beam expander and body and receiving the laser light beam with the desired spot size so as to irradiate the body of thermo-photo refractive material to a desired depth which corresponds to the desired spot size and at which a plurality of spaced apart parallel VBGs are recorded and; wherein the laser, upsteam mirror and beam expander are operative to move while the phase mask is stationary.

10. The system of claim 9 further comprising a first linear actuator operative to linearly displace the laser, upstream mirror and beam expander relative to the phase mask so as to irradiate a desired region of the material including the multiple sub-regions with uniform intensity, wherein the phase mask is mounted on a mask support displaceably fixed to the material support.

11. The system of claim 9 further comprising a second actuator operative to rotate supports for respective material and mask relative to one another about a vertical so as to provide the plurality of VBGs extending transversely to the vertical, and a dice unit operative to cut the material into a plurality of individual units.

12. The system of claim 11, wherein the dice unit is operative to cut the material into a plurality of units provided with one or more VBGs.

13. The system of claim 12, wherein the second actuator is operative to displace the mask and material support so that upon cutting the material into the plurality of units each have a cross-section selected from the group consisting of parallelepiped-shaped and rectangularly-shaped units.

14. The system of claim 13, wherein the mask and material support are displaced so that each of the so that the parallelepiped-shaped units each is provided with one or more VBGs extending perpendicular to opposite top and bottom of the unit.

15. The system of claim 13, wherein the mask and material support are displaced so that each of the so that the rectangularly-shaped units each are provided with one or more VBGs extending at an angle different from a right one between opposite top and bottom of the unit.

16. The system of claim 11, wherein the material support is configured to support a one-piece slab of the material.

17. The system of claim 11, wherein the material support is configured to have individual pieces of material stacked together.

18. The system of claim 11, wherein the mask and material support are displaced so that each of the rectangularly-shaped units is provided with one or more VBGs extending parallel to opposite sides of the unit.

19. The system of claim 9 further comprising a scanning light reflecting element receiving the beam light with the desired spot size upstream from the mask and downstream from the expander.

* * * * *